(12) United States Patent
Park

(10) Patent No.: US 10,916,623 B2
(45) Date of Patent: Feb. 9, 2021

(54) SEMICONDUCTOR DEVICE INCLUDING CAPACITOR AND METHOD OF FORMING THE SAME

(71) Applicant: Samsung Electronics Co., Ltd., Suwon-si (KR)

(72) Inventor: Seok Han Park, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/412,961

(22) Filed: May 15, 2019

(65) Prior Publication Data
US 2020/0212170 A1    Jul. 2, 2020

(30) Foreign Application Priority Data

Dec. 28, 2018  (KR) .................. 10-2018-0172273

(51) Int. Cl.
| | |
|---|---|
| *H01L 49/02* | (2006.01) |
| *H01L 27/108* | (2006.01) |
| *H01L 29/40* | (2006.01) |

(52) U.S. Cl.
CPC ........ *H01L 28/82* (2013.01); *H01L 27/10808* (2013.01); *H01L 29/401* (2013.01)

(58) Field of Classification Search
CPC ............... H01L 28/82–92; H01L 2/60; H01L 27/10817; H01L 27/10808; H01L 27/1085–10867; H01G 4/005
See application file for complete search history.

(56) References Cited

U.S. PATENT DOCUMENTS

| | | | |
|---|---|---|---|
| 8,816,475 B2 | 8/2014 | Jin | |
| 8,974,678 B2 | 3/2015 | Millward | |
| 9,385,129 B2 | 7/2016 | Kang | |
| 9,812,333 B2 | 11/2017 | Kim et al. | |
| 2001/0050386 A1* | 12/2001 | Suzuki | .............. H01L 21/76838 |
| | | | 257/296 |
| 2004/0058235 A1* | 3/2004 | Huang | ................ H01M 4/0433 |
| | | | 429/164 |
| 2014/0084419 A1 | 3/2014 | Shih et al. | |
| 2017/0345886 A1* | 11/2017 | Yi | ..................... H01L 27/10814 |

FOREIGN PATENT DOCUMENTS

| | | |
|---|---|---|
| JP | 2002-124640 A | 4/2002 |
| KR | 10-1998-0012481 A | 4/1998 |

OTHER PUBLICATIONS

Minglin Ma, et al., "Gyroid-Forming Diblock Copolymers Confined in Cylindrical Geometry: A Case of Extreme Makeover for Domain Morphology Citation", Macromolecules 43.6, 2010, pp. 3061-3071, American Chemical Society.
Priyanka Dobriyal et al., "Cylindrically Confined Diblock Copolymers", Macromolecules vol. 42, No. 22, pp. 9082-9088, American Chemical Society, Sep. 23, 2009.

* cited by examiner

*Primary Examiner* — Alia Sabur
(74) *Attorney, Agent, or Firm* — Harness, Dickey & Pierce, P.L.C.

(57) ABSTRACT

A semiconductor device including one or more switches on a substrate, a first electrode connected to the one or more switches and having a helical shape defining a spiral groove, a support in contact with the first electrode, the spiral groove extending between the support and a portion of the first electrode, a capacitor dielectric layer in contact with the first electrode, and a second electrode in contact with the capacitor dielectric layer.

20 Claims, 7 Drawing Sheets

SEMICONDUCTOR DEVICE INCLUDING CAPACITOR AND METHOD OF FORMING THE SAME

CROSS-REFERENCE TO RELATED APPLICATION

This U.S. non-provisional patent application claims priority under 35 U.S.C. § 119 to, and the benefit of, Korean Patent Application No. 10-2018-0172273, filed on Dec. 28, 2018, in the Korean Intellectual Property Office (KIPO), the disclosure of which is incorporated herein by reference in its entirety.

BACKGROUND

1. Field

Devices and methods consistent with some example embodiments relate to a semiconductor device including a capacitor and a method of forming the same.

2. Description of Related Art

Various methods for improving capacitance of a capacitor while reducing a size of the capacitor have been studied for high integration of semiconductor devices. Electrode layers are three-dimensionally arranged and a capacitor dielectric layer is interposed between the electrode layers. The capacitance of the capacitor may be determined in proportion to area sizes of respective surfaces of the electrode layers that face one another.

SUMMARY

Some example embodiments of the inventive concepts are directed to providing a semiconductor device including a capacitor which is advantageous for high integration and is capable of maximizing and/or improving capacitance thereof and a method of forming the same.

According to some example embodiments, there is provided a semiconductor device including one or more switches on a substrate, a first electrode connected to the one or more switches and having a helical shape defining a spiral groove, a support in contact with the first electrode, the spiral groove extending between the support and a portion of the first electrode, a capacitor dielectric layer in contact with the first electrode, and a second electrode in contact with the capacitor dielectric layer.

According to some example embodiments, there is provided a semiconductor device including a conductive pattern on a substrate, a first electrode on the conductive pattern and having a helical shape defining a spiral groove, a support in contact with the first electrode, the spiral groove extending between the support and a first portion of the first electrode, a capacitor dielectric layer in contact with the first electrode; and a second electrode in contact with the capacitor dielectric layer.

According to some example embodiments, there is provided a method of forming a semiconductor device including forming a conductive pattern on a substrate, forming a mold layer on the conductive pattern, forming an electrode hole extending through the mold layer, forming a sacrificial pattern in the electrode hole, forming a first electrode in the electrode hole, the first electrode having a helical shape defining a spiral groove corresponding to the sacrificial pattern, removing the mold layer and the sacrificial pattern, forming a capacitor dielectric layer in contact with the first electrode, and forming a second electrode in contact with the capacitor dielectric layer.

DETAILED DESCRIPTION OF EXAMPLE EMBODIMENTS

Figure 1:
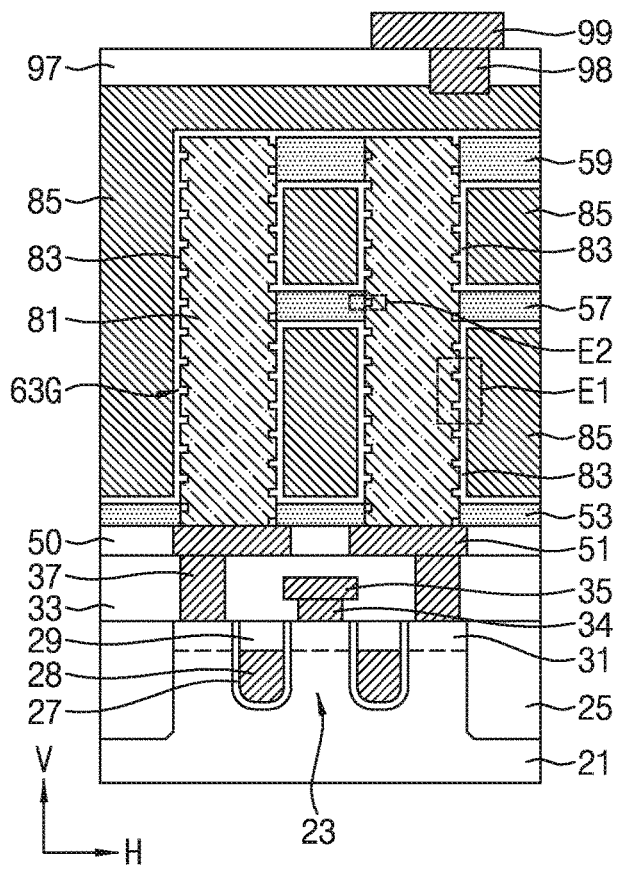
FIG. 1 is a schematic cross-sectional view of a semiconductor device according to some example embodiments of the inventive concepts.
Figure 2:
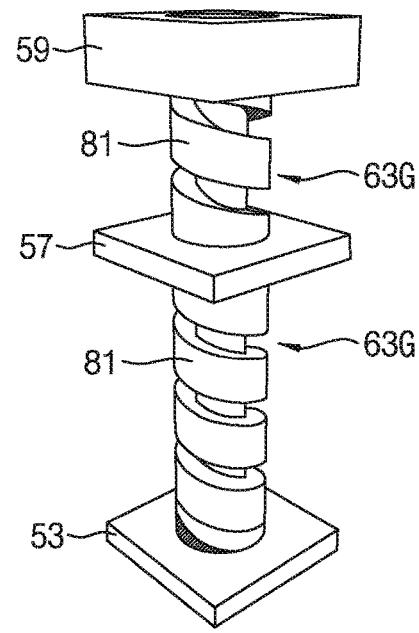
FIG. 2 is a perspective view showing a component of the semiconductor device of FIG. 1.

FIG. 1 is a cross-sectional view for describing a semiconductor device according to some example embodiments of the inventive concepts, and FIG. 2 is a perspective view showing a component (e.g., a first electrode 81) of FIG. 1 for describing the semiconductor device. FIGS. 3 to 11 are enlarged views showing portions of FIG. 1 for describing the semiconductor device. In some example embodiments, the semiconductor device may include a dynamic random access memory (DRAM).

Referring to FIG. 1, the semiconductor device according to some example embodiments of the inventive concepts may include a substrate 21, an active region 23, a device isolation layer 25, a gate dielectric layer 27, a plurality of gate electrodes 28, a gate capping layer 29, source/drain regions 31, an interlayer insulating layer 33, a bit contact plug 34, a bit line 35, a plurality of buried contact plugs 37, a pad isolation layer 50, a plurality of conductive pads 51, an etch stop layer 53, one or more supports 57 and 59, a plurality of first electrodes 81, a capacitor dielectric layer 83, a second electrode 85, an upper insulating layer 97, an upper contact plug 98, and/or an upper interconnection 99.

Each of the plurality of conductive pads 51 may be referred to as a conductive pattern. The one or more supports 57 and 59 may include a first support 57 and/or a second support 59. Each of the plurality of first electrodes 81 may include at least one spiral groove 63G. According to some example embodiments, each of the plurality of first electrodes 81 has a helical shape defining the spiral groove 63G. The at least one spiral groove 63G may be disposed in side surfaces of the plurality of first electrodes 81. Each of the plurality of first electrodes 81 may correspond to a storage electrode and/or a storage node. Each of the plurality of first electrodes 81 may be referred to as a lower electrode, and the second electrode 85 may be referred to as an upper electrode. The plurality of first electrodes 81, the capacitor dielectric layer 83, and the second electrode 85 may constitute a plurality of capacitors.

The active region 23, the gate dielectric layer 27, the plurality of gate electrodes 28, and the source/drain regions 31 may constitute a plurality of transistors. In an example embodiment, each of the plurality of transistors may serve as a switching element (e.g., one or more switches). In an example embodiment, the plurality of transistors may include a Fin Field-effect transistor (FinFET), a multi-bridge channel (MBC) transistor, a nanowire transistor, a vertical transistor, a recess channel transistor, a 3-dimensional (3D) transistor, a planar transistor, or a combination thereof. In an example embodiment, the switching element may be composed of other active and/or passive elements such as diodes.

The plurality of conductive pads 51 may be connected to the source/drain regions 31 via the plurality of buried contact plugs 37. Each of the plurality of first electrodes 81 may be connected to the switching element via the plurality of conductive pads 51 and the plurality of buried contact plugs 37.

Referring to FIG. 2, the first electrode 81 may include the spiral groove 63G. The spiral groove 63G may be disposed in the side surface of the first electrode 81. The first electrode 81 may pass through the second support 59, the first support 57, and/or the etch stop layer 53. The first electrode 81 may be in direct contact (e.g., without intervening elements) with side surfaces of the second support 59, the first support 57, and/or the etch stop layer 53. The spiral groove 63G may pass between the second support 59 and the first electrode 81, between the first support 57 and the first electrode 81, and/or between the etch stop layer 53 and the first electrode 81.

Referring again to FIGS. 1 and 2, the pad isolation layer 50 and the plurality of conductive pads 51 may be disposed on (e.g., above) the substrate 21. Upper surfaces of the pad isolation layer 50 and the plurality of conductive pads 51 may be coplanar and/or substantially coplanar. The etch stop layer 53 may be disposed on the pad isolation layer 50 and the plurality of conductive pads 51. The plurality of first electrodes 81 may be disposed to pass through the etch stop layer 53 so as to come into direct contact with the plurality of conductive pads 51. Each of the plurality of first electrodes 81 may protrude at a level that is higher than that of an upper surface of the etch stop layer 53. A vertical height of each of the plurality of first electrodes 81 may be greater than a horizontal width of each of the plurality of first electrodes 81. As depicted, the vertical direction (depicted in FIG. 1 as "V") as discussed herein is normal to the top surface of the substrate 21 such that the pad isolation layer 50 is further in the vertical direction than the substrate 21. As discussed herein, the horizontal direction (e.g., "H" as depicted in FIG. 1, or a direction opposite thereto) is perpendicular or nearly perpendicular to the vertical direction. Each of the plurality of first electrodes 81 may have the spiral groove 63G.

The one or more supports 57 and 59 which are in direct contact with the side surfaces of the plurality of first electrodes 81 may be disposed at a higher level than the etch stop layer 53. For example, the first support 57 which is in direct contact with the side surfaces of the plurality of first electrodes 81 may be disposed at a higher level than the etch stop layer 53. The second support 59 which is in direct contact with the side surface of the plurality of first electrodes 81 may be disposed at a higher level than the first support 57.

The capacitor dielectric layer 83 may be disposed on (e.g., in contact with) the plurality of first electrodes 81. The capacitor dielectric layer 83 may cover the side surfaces and/or upper surfaces of the plurality of first electrodes 81. The capacitor dielectric layer 83 may be in direct contact with the side surfaces and/or the upper surfaces of the plurality of first electrodes 81. The capacitor dielectric layer 83 may extend to an inner side of the spiral groove 63G (e.g., cover the surface(s) of the plurality of first electrodes 81 in the area of the spiral groove(s) 63G). The capacitor dielectric layer 83 may cover the upper surface of the etch stop layer 53. The capacitor dielectric layer 83 may cover upper surfaces and lower surfaces of the first support 57 and/or the second support 59.

The second electrode 85 may be disposed on (e.g., in contact with) the capacitor dielectric layer 83. The second electrode 85 may be in direct contact with the capacitor dielectric layer 83. The capacitor dielectric layer 83 may be interposed between the second electrode 85 and the plurality of first electrodes 81, between the second electrode 85 and the etch stop layer 53, between the second electrode 85 and the first support 57, and/or between the second electrode 85 and the second support 59.

Figure 3:
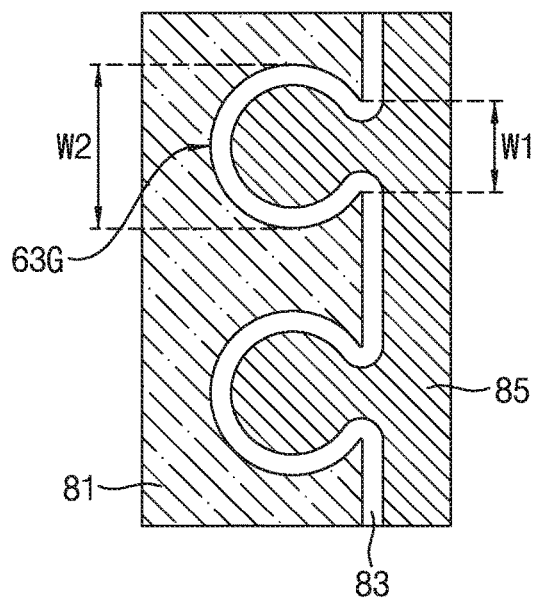
FIGS. 3-11 are enlarged views showing portions of the semiconductor device of FIG. 1.

FIGS. 3-8 may depict a portion E1 of the semiconductor device of FIG. 1, according to some example embodiments. Referring to FIG. 3, a width of an entrance of the spiral groove 63G may be smaller than a central width of the spiral groove 63G. The spiral groove 63G may have a maximum or upper limit width at a position adjacent to the center of the spiral groove 63G (e.g., the spiral groove 63G may have a maximum or upper limit width at the center of the spiral groove 63G). The entrance of the spiral groove 63G may have a first width W1. The maximum or upper limit width of the spiral groove 63G may be a second width W2. The first width W1 may be smaller than the second width W2. The second electrode 85 may extend to the inner side of the spiral groove 63G. The capacitor dielectric layer 83 may extend to the inner side of the spiral groove 63G.

Figure 4:
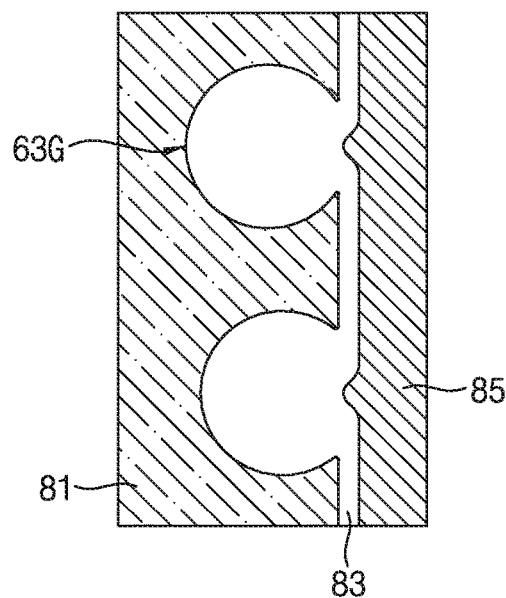
Figure 5:
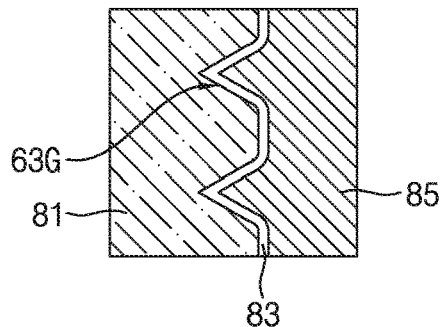
Figure 6:
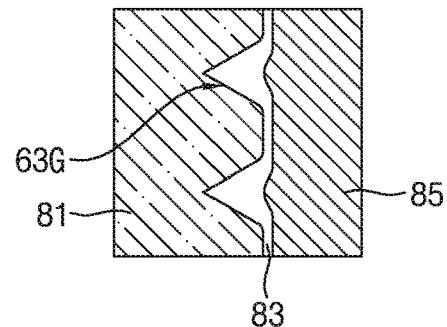
Figure 7:
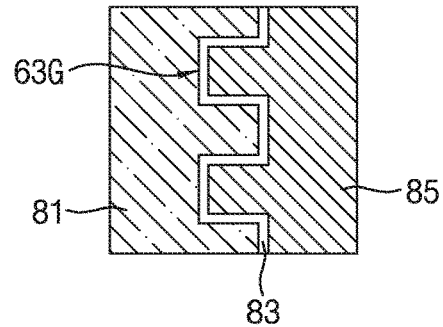
Figure 8:
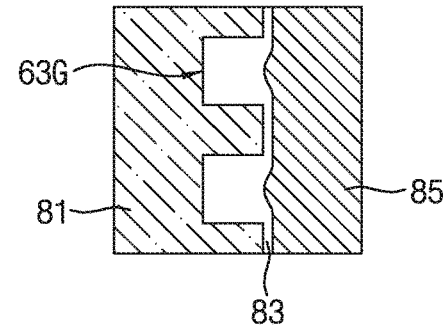

Referring to FIG. 4, an inner side of the spiral groove 63G may be fully or mostly filled with the capacitor dielectric layer 83. The second electrode 85 may be disposed on an outside of the spiral groove 63G.

Referring to FIGS. 5 to 8, the spiral grooves 63G may have various shapes. In some example embodiments, referring to FIGS. 5-6, the spiral grooves 63G may be triangular in shape. In some example embodiments, referring to FIGS. 7-8, the spiral grooves 63G may be rectangular and/or square in shape. In some example embodiments, referring to FIGS. 5 and 7, the second electrode 85 and the capacitor dielectric layer 83 may extend to the inner side of the spiral grooves 63G. In some example embodiments, referring to FIGS. 6 and 8, the inner side of the spiral groove 63G may be fully or mostly filled with the capacitor dielectric layer 83, and the second electrode 85 may be disposed on the outside of the spiral groove 63G.

Figure 9:
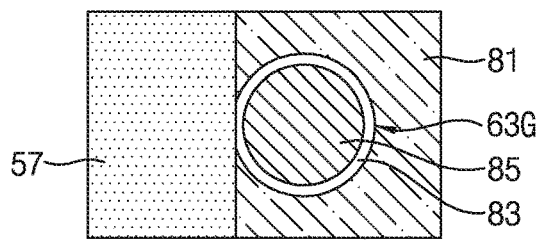
Figure 10:
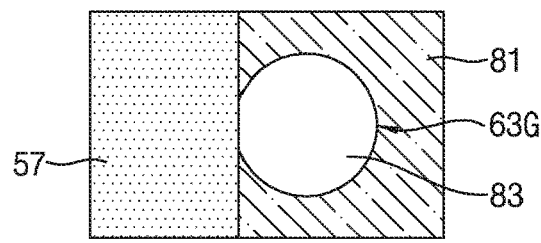
Figure 11:
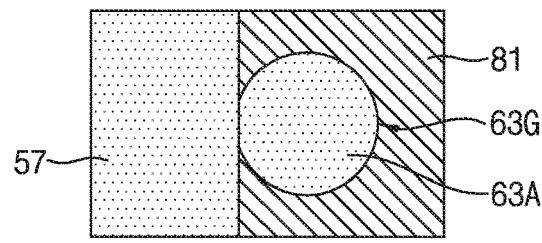

FIGS. 9-11 may depict a portion E2 of the semiconductor device of FIG. 1, according to some example embodiments. Referring to FIG. 9, between the first support 57 and the first electrode 81 (e.g., a portion of the first electrode 81), the capacitor dielectric layer 83 may extend to the inner side of the spiral groove 63G. Between the first support 57 and the first electrode 81 (e.g., a portion of the first electrode 81), the second electrode 85 may extend to the inner side of the spiral groove 63G.

Referring to FIG. 10, between the first support 57 and the first electrode 81, the inner side of the spiral groove 63G may be fully or mostly filled with the capacitor dielectric layer 83.

Referring to FIG. 11, between the first support 57 and the first electrode 81, a sacrificial pattern 63A may be disposed in the inner side of the spiral groove 63G. The sacrificial pattern 63A may include a material different from those of the first support 57 and the first electrode 81. In an example embodiment, the sacrificial pattern 63A may include a spontaneous molecular assembly nano structure formed by micro-phase separation of a block-copolymer layer. The block-copolymer layer may include an inorganic-organic diblock copolymer, an organic-organic diblock copolymer, a brush copolymer of the inorganic-organic diblock copolymer, a brush copolymer of the organic-organic diblock copolymer, or a combination thereof. The sacrificial pattern 63A may be in direct contact with the first support 57 and/or the first electrode 81.

FIGS. 12 to 15, 17, 20, 22, and 24 are cross-sectional views for describing a method of forming a semiconductor device according to some example embodiments of the inventive concepts, and FIGS. 16, 18, 21, and 23 are perspective views showing a partial configuration of a corresponding one of FIGS. 15, 17, 20, and 22. FIG. 19 shows partial cross-sectional views of FIG. 18.

Figure 12:
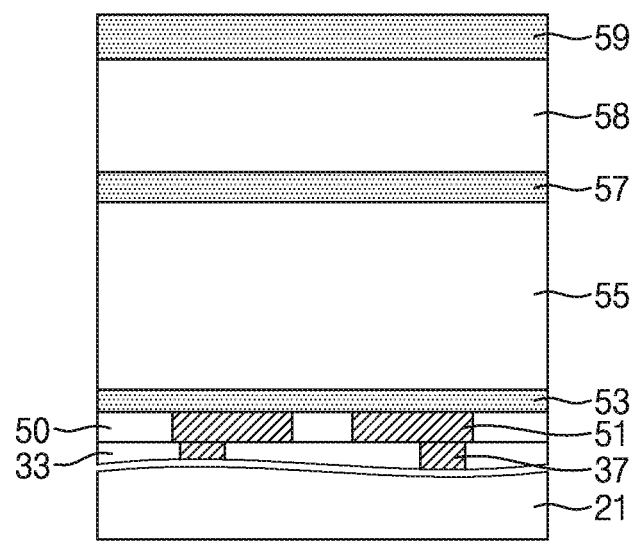
FIGS. 12-15, 17, 20, 22 and 24 are cross-sectional views for describing a method of forming a semiconductor device according to some example embodiments of the inventive concepts.

Referring to FIGS. 1 and 12, an interlayer insulating layer 33, a plurality of buried contact plugs 37, a pad isolation layer 50, and a plurality of conductive pads 51 may be formed on (e.g., above) a substrate 21. An etch stop layer 53, one or more mold layers 55 and/or 58, and one or more supports 57 and/or 59 may be formed on (e.g., above) the pad isolation layer 50 and the plurality of conductive pads 51. In an example embodiment, the one or more mold layers 55 and 58 may include a first mold layer 55 and/or a second mold layer 58. The one or more supports 57 and/or 59 may include a first support 57 and/or a second support 59. Each of the plurality of conductive pads 51 may be referred to as a conductive pattern.

In an example embodiment, various components may be additionally formed on the substrate 21 as shown in FIG. 1. For example, a device isolation layer 25 which defines an active region 23 in the substrate 21 may be formed. The substrate 21 may include a semiconductor substrate such as a silicon wafer and/or a silicon-on-insulator (SOI) wafer. The device isolation layer 25 may include an insulating material such as silicon oxide, silicon nitride, silicon oxynitride, silicon oxycarbonitride (SiOCN), low-K dielectrics, high-K dielectrics, or a combination thereof.

A gate dielectric layer 27, a plurality of gate electrodes 28, and/or a gate capping layer 29 may be formed on (e.g., above) the active region 23. Source/drain regions 31 may be formed in the active region 23 adjacent to the plurality of gate electrodes 28. The gate dielectric layer 27 may be interposed between the active region 23 and the plurality of gate electrodes 28. The gate dielectric layer 27 may include an insulating material such as silicon oxide, silicon nitride, silicon oxynitride, high-K dielectrics, or a combination thereof. The plurality of gate electrodes 28 may be formed at a lower level than an upper end of the active region 23 (e.g., the plurality of gate electrodes 28 may have lower ends below the upper end of the active region 23). The plurality of gate electrodes 28 may include a conductive material such as a metal, a metal nitride, a metal oxide, a metal silicide, polysilicon, a conductive carbon, or a combination thereof. Each of the plurality of gate electrodes 28 may correspond to a word line. The gate capping layer 29 may cover the plurality of gate electrodes 28. The gate capping layer 29 may include an insulating material such as silicon oxide, silicon nitride, silicon oxynitride, silicon oxycarbonitride, low-K dielectrics, high-K dielectrics, or a combination thereof. The source/drain regions 31 may include impurities having a different conductivity type from the active region 23. For example, the active region 23 may include P-type impurities, and the source/drain regions 31 may include N-type impurities.

An interlayer insulating layer 33 may be formed which covers the active region 23, the device isolation layer 25, the gate dielectric layer 27, the plurality of gate electrodes 28, the gate capping layer 29, and/or the source/drain regions 31. The interlayer insulating layer 33 may include an insulating material such as silicon oxide, silicon nitride, silicon oxynitride, silicon oxycarbonitride, low-K dielectrics, high-K dielectrics, or a combination thereof.

A bit contact plug 34 and a bit line 35 may be formed in the interlayer insulating layer 33. The bit line 35 may be connected to at least one of the source/drain regions 31 via the bit contact plug 34. The plurality of buried contact plugs 37 may be formed in the interlayer insulating layer 33. Each of the plurality of buried contact plugs 37 may pass through the interlayer insulating layer 33 to be connected to at least one of the source/drain regions 31. The bit contact plug 34, the bit line 35, and/or the plurality of buried contact plugs 37 may include a conductive material such as a metal, a metal nitride, a metal oxide, a metal silicide, polysilicon, a conductive carbon, or a combination thereof.

The pad isolation layer 50 and the plurality of conductive pads 51 may be formed on (e.g., above) the interlayer insulating layer 33. Each of the plurality of conductive pads 51 may pass through the pad isolation layer 50 to come into contact with at least one of the plurality of buried contact plugs 37. The pad isolation layer 50 may be formed between and/or adjacent to the plurality of conductive pads 51. Upper surfaces of the pad isolation layer 50 and the plurality of conductive pads 51 may be coplanar or substantially coplanar. The pad isolation layer 50 may include an insulating material such as silicon oxide, silicon nitride, silicon oxynitride, silicon oxycarbonitride, low-K dielectrics, high-K dielectrics, or a combination thereof. The plurality of conductive pads 51 may include a conductive material such as a metal, a metal nitride, a metal oxide, a metal silicide, polysilicon, a conductive carbon, or a combination thereof.

The etch stop layer 53 may be formed to cover the pad isolation layer 50 and/or the plurality of conductive pads 51. The first mold layer 55, the first support 57, the second mold layer 58, and the second support 59 may be sequentially stacked on the etch stop layer 53. The etch stop layer 53 may be thinner than the first mold layer 55. The etch stop layer 53 may include an insulating layer having an etch selectivity with respect to the one or more mold layers 55 and 58. The one or more supports 57 and/or 59 may include an insulating layer having an etch selectivity with respect to the one or more mold layers 55 and 58. The first support 57 may be thinner than the first mold layer 55. In an example embodiment, each of the etch stop layer 53, the first support 57, and/or the second support 59 may include a nitride, such as silicon nitride, and each of the first mold layer 55 and/or the second mold layer 58 may include an oxide such as silicon oxide.

Figure 13:
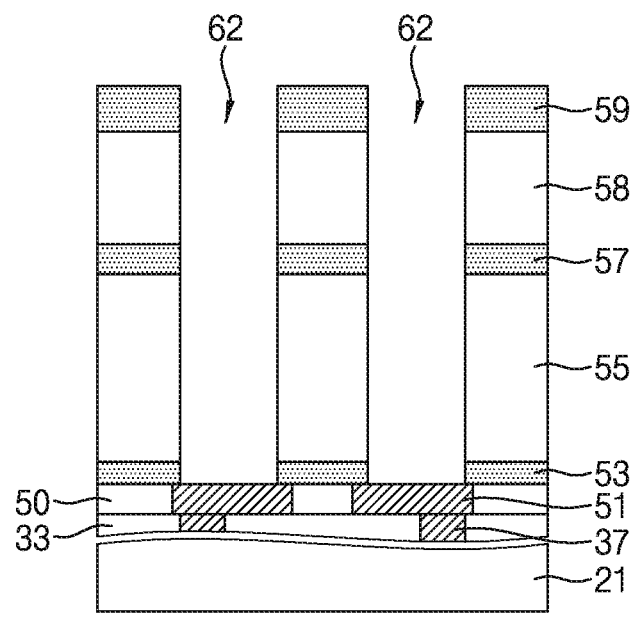

Referring to FIG. 13, a plurality of electrode holes 62 may be formed (e.g., by an etching process) to pass (e.g., extend) through the second support 59, the second mold layer 58, the first support 57, the first mold layer 55, and/or the etch stop layer 53. The plurality of conductive pads 51 may be exposed to bottoms of the plurality of electrode holes 62. A vertical height of each of the plurality of electrode holes 62 may be greater than a horizontal width thereof. Side surfaces of the second support 59 and/or the first support 57 may be exposed to sidewalls of the plurality of electrode holes 62.

Figure 14:
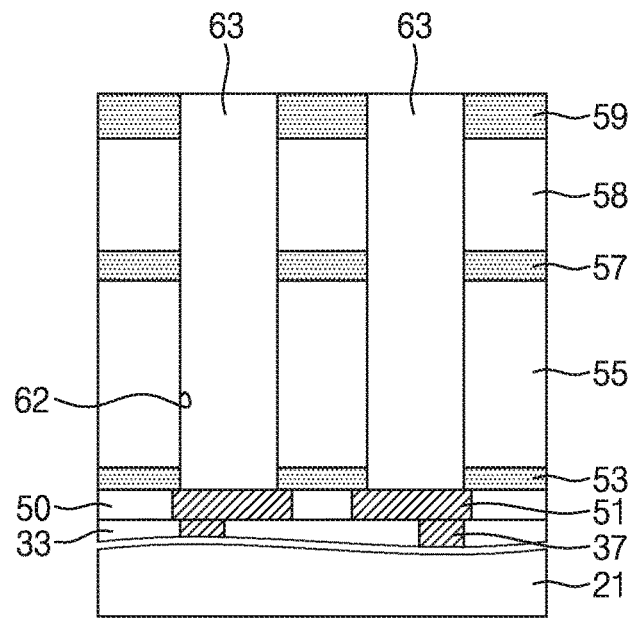

Referring to FIG. 14, a block-copolymer layer 63 may be formed in the plurality of electrode holes 62. The block-copolymer layer 63 may include an inorganic-organic diblock copolymer, an organic-organic diblock copolymer, a brush copolymer of the inorganic-organic diblock copolymer, a brush copolymer of the organic-organic diblock copolymer, or a combination thereof. Each of the plurality of electrode holes 62 may be fully or mostly filled with the block-copolymer layer 63.

Figure 15:
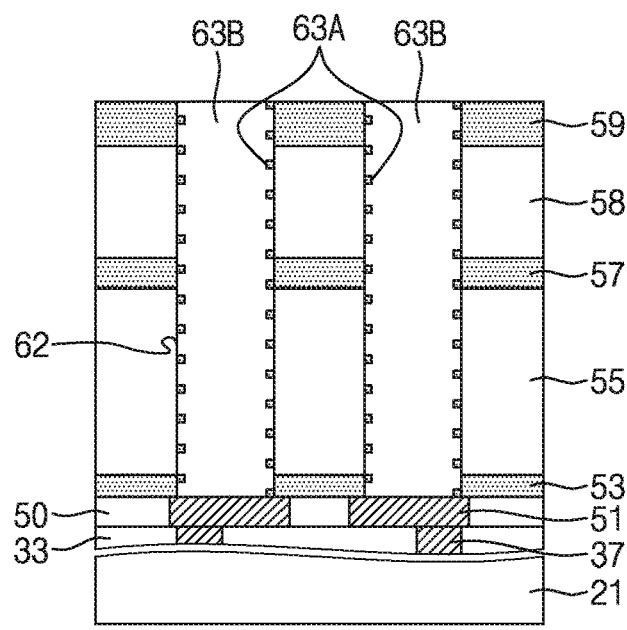
Figure 16:
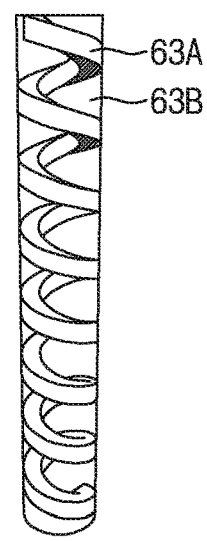
FIGS. 16, 18, 21 and 23 are perspective views showing a partial configuration of a corresponding one of FIGS. 15, 17, 20 and 22.

Referring to FIGS. 15 and 16, a plurality of sacrificial patterns 63A and a reaction byproduct 63B may be formed by micro-phase separation of the block-copolymer layer 63. Each of the plurality of sacrificial patterns 63A may have a spiral shape. Each of the plurality of sacrificial patterns 63A may be formed adjacent to the sidewalls of the plurality of electrode holes 62. Each of the plurality of sacrificial patterns 63A may be in direct contact with the sidewalls of the plurality of electrode holes 62. The plurality of sacrificial patterns 63A may be in direct contact with side surfaces of the second support 59, the second mold layer 58, the first support 57, the first mold layer 55, and/or the etch stop layer 53.

In an example embodiment, the block-copolymer layer 63 may include a material layer in which polymer chains having two or more chemically different properties are connected. The plurality of sacrificial patterns 63A may include a spontaneous molecular assembly nano structure formed by micro-phase separation of the block-copolymer layer 63. A desired shape of the plurality of sacrificial patterns 63A may be controlled by a composition, size, shape, or combination thereof of the block-copolymer layer 63. The desired shape of the plurality of sacrificial patterns 63A may be adjusted by a condition of the micro-phase separation. The desired shape of the plurality of sacrificial patterns 63A may be controlled by a material exposed to the bottoms and/or the sidewalls of the plurality of electrode holes 62. The micro-phase separation of the block-copolymer layer 63 may include a process in which heat treatment is performed at a temperature that is higher than a glass transition temperature (Tg).

Figure 17:
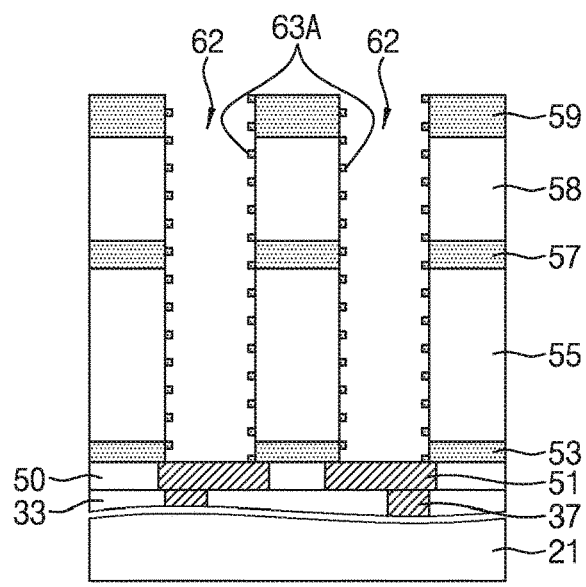
Figure 18:
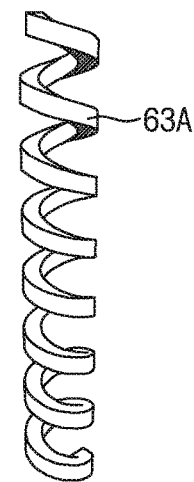
Figure 19:
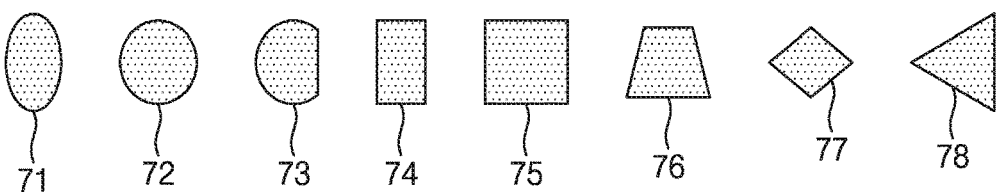
FIG. 19 shows partial cross-sectional views of FIG. 18.

Referring to FIGS. 17 and 18, the plurality of sacrificial patterns 63A may be exposed to inner sides of the plurality of electrode holes 62 by removing the reaction byproduct 63B. Each of the plurality of sacrificial patterns 63A may include a spiral-shaped spontaneous molecular assembly nano structure. For example, the reaction byproduct 63B may be removed using an ashing process.

Referring to FIG. 19, a cross section of each of the plurality of sacrificial patterns 63A may have any shape such as a shape of an ellipse 71, a circle 72, a semicircle 73, a rectangle 74, a square 75, a trapezoid 76, a rhombus 77, a triangle 78, or a combination thereof.

Figure 20:
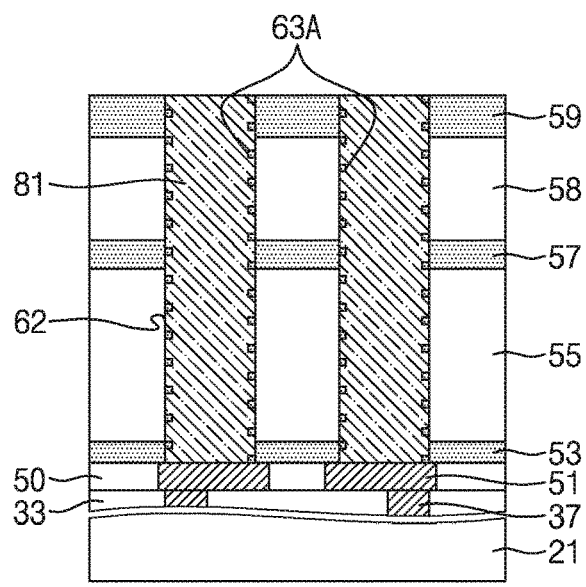
Figure 21:
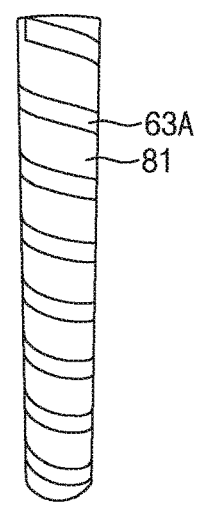

Referring to FIGS. 20 and 21, a plurality of first electrodes 81 may be formed in the plurality of electrode holes 62. A vertical height of each of the plurality of first electrodes 81 may be greater than a horizontal width thereof. The plurality of first electrodes 81 may be in direct contact with the plurality of conductive pads 51. The plurality of sacrificial patterns 63A may remain between the sidewalls of the plurality of electrode holes 62 and the plurality of first electrodes 81. The plurality of sacrificial patterns 63A may remain alongside surfaces of the plurality of first electrodes 81.

The plurality of first electrodes 81 may be formed using a thin film forming process and/or a planarization process. The planarization process may include a chemical mechanical polishing (CMP) process, an etch-back process, or a combination thereof. The plurality of first electrodes 81 may include a conductive material such as a metal, a metal nitride, a metal oxide, a metal silicide, polysilicon, a conductive carbon, or a combination thereof. For example, the plurality of first electrodes 81 may include Ti, TiN, Ta, TaN, W, WN, Ru, or a combination thereof.

Figure 22:
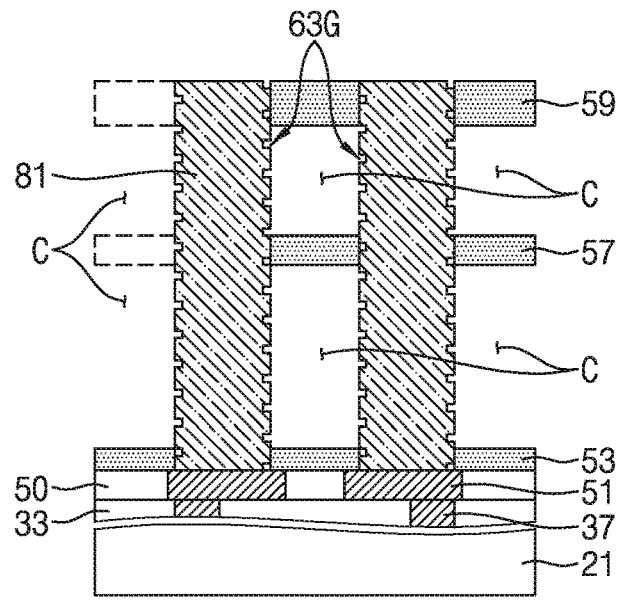
Figure 23:
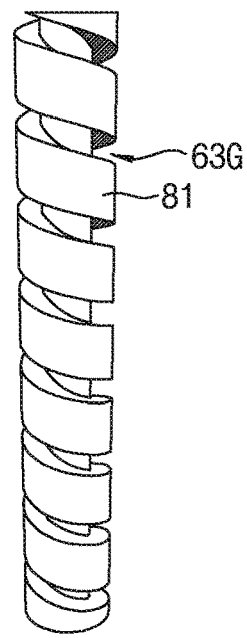

Referring to FIGS. 22 and 23, the first support 57 and/or the second support 59 may be partially removed and the first mold layer 55, the second mold layer 58, and/or the plurality of sacrificial patterns 63A may be removed so that an empty space C and a plurality of spiral grooves 63G may be formed. The plurality of first electrodes 81 may be exposed to an inner side of the empty space C. A shape of each of the plurality of spiral grooves 63G may correspond to that of each of the plurality of sacrificial patterns 63A. The plurality of spiral grooves 63G may be formed along the side surfaces of the plurality of first electrodes 81. The side surfaces of the plurality of first electrodes 81 may be in direct contact with side surfaces of the etch stop layer 53, the first support 57, and/or the second support 59. The plurality of spiral grooves 63G may pass between the plurality of first electrodes 81 and the etch stop layer 53, between the plurality of first electrodes 81 and the first support 57, and/or between the plurality of first electrodes 81 and the second support 59.

Figure 24:
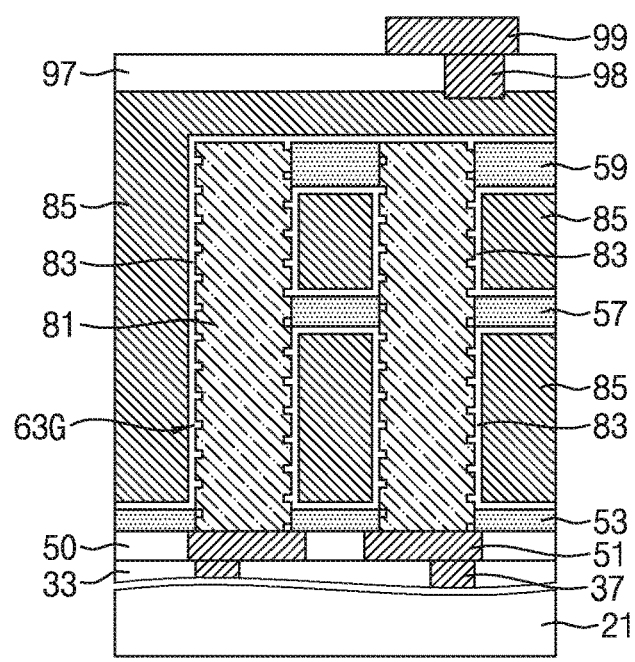

Referring to FIG. 24, a capacitor dielectric layer 83 and a second electrode 85 may be sequentially formed on the plurality of first electrodes 81. An upper insulating layer 97 may be formed on the second electrode 85. An upper contact plug 98 may be formed to pass through the upper insulating layer 97 so as to come into contact with the second electrode layer 85. An upper interconnection 99 in contact with the upper contact plug 98 may be formed on, in and/or through the upper insulating layer 97.

The capacitor dielectric layer 83 may cover surfaces of the plurality of first electrodes 81, cover the etch stop layer 53, cover an upper surface and/or a lower surface of the first support 57, and/or cover an upper surface and/or a lower surface of the second support 59. The capacitor dielectric layer 83 may include an insulating material such as silicon oxide, silicon nitride, silicon oxynitride, high-K dielectrics, or a combination thereof. For example, the capacitor dielectric layer 83 may include a metal oxide such as AlO, HfO, HfSiO, RuO, or a combination thereof.

The empty space C (e.g., all or most of the empty space C remaining after forming the capacitor dielectric layer 83) may be filled with the second electrode 85, and the second electrode 85 may cover the plurality of first electrodes 81 and/or the second support 59. Each of the second electrode 85, the upper contact plug 98, and/or the upper interconnection 99 may include a conductive material such as a metal, a metal nitride, a metal oxide, a metal silicide, polysilicon, a conductive carbon, or a combination thereof. The upper insulating layer 97 may include an insulating material such as silicon oxide, silicon nitride, silicon oxynitride, silicon oxycarbonitride, low-K dielectrics, high-K dielectrics, or a combination thereof.

Figure 25:
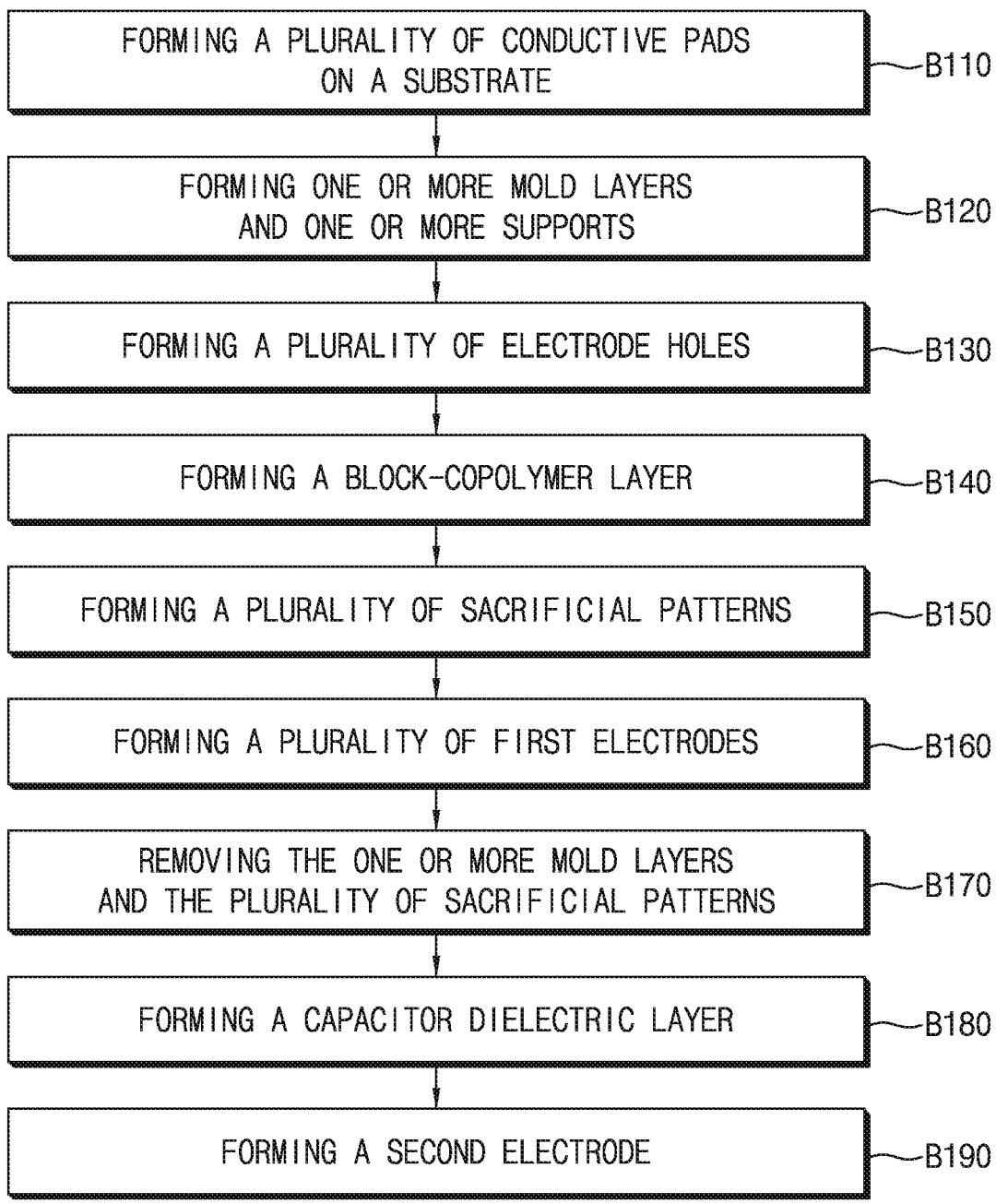
FIG. 25 is a flowchart of a method of forming a semiconductor device according to some example embodiments of the inventive concepts.

FIG. 25 is a flowchart of a method of forming a semiconductor device according to some example embodiments of the inventive concepts.

Referring to FIG. 25, The method of forming the semiconductor device may include forming a plurality of conductive pads on a substrate (B110), forming one or more mold layers and one or more supports on the plurality of conductive pads (B120), forming a plurality of electrode holes extending through the one or more mold layers and the one or more supports (B130), forming a block-copolymer layer in the plurality of electrode holes (B140), forming a plurality of sacrificial patterns in the plurality of electrode holes (B150), forming a plurality of first electrodes in the plurality of electrode holes (B160), removing the one or more mold layers and the plurality of sacrificial patterns (B170), forming a capacitor dielectric layer in contact with the plurality of first electrodes (B180), and forming a second electrode in contact with the capacitor dielectric layer (B190).

Each of the plurality of sacrificial patterns may have a spiral shape. Each of the plurality of first electrodes may have a helical shape defining a spiral groove corresponding to the plurality of sacrificial patterns. The forming the plurality of sacrificial patterns may include performing micro-phase separation on the block-copolymer layer. Each of the plurality of sacrificial patterns may include a spontaneous molecular assembly nano structure formed by the performing micro-phase separation. The one or more supports may be in contact with the plurality of first electrodes. The spiral groove may extend between the one or more supports and a portion of the plurality of first electrodes.

The capacitance of a capacitor is proportional to the surface areas of counter-facing surfaces of electrode layers of the capacitor. Accordingly, a tradeoff exists between increasing the capacitance of a capacitor and decreasing the size (e.g., physical dimensions) of the capacitor. According to some example embodiments of the inventive concepts, a first electrode having a spiral groove, a second electrode facing the first electrode, and a capacitor dielectric layer formed between the first electrode and the second electrode are provided. Capacitance of a capacitor may be significantly increased due to the spiral groove disposed in a side surface of the first electrode that increases the surface area of the first electrode (e.g., increases the aspect ratio with respect to the second electrode) while providing sufficient structural stability (e.g., collapse, warping, etc.) and/or uniformity (e.g., scattering of size, scattering of shape, etc.). A semiconductor device including a capacitor which is advantageous for high integration and is capable of maximizing and/or improving capacitance thereof may be implemented.

Spatially relative terms, such as "below," "lower," "above," "upper," "higher," "top," "side," "on," "vertical," "horizontal," "lateral," "cover," and the like, may be used herein for ease of description to describe one element or feature's relationship to another element(s) or feature(s) as illustrated in the figures. For example, as used herein, the terms "upper," "higher," "on," "cover," and/or "top" may refer to an element or feature further in the vertical direction (as depicted in FIG. 1) with respect to another element or feature, the terms "horizontal," "lateral," and/or "side" may refer to an element or feature with respect to a direction perpendicular or nearly perpendicular to the vertical direction (e.g., the horizontal direction depicted in FIG. 1 and/or a direction opposite thereto), and the terms "lower," "bottom," and/or "below" may refer to an element or feature further in a direction opposite the vertical direction with respect to another element or feature. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be understood that when an element is referred to as being "connected" or "coupled" to another element, it can be directly connected, contacted and/or coupled to the other element or intervening elements may be present. As used herein the term "and/or" includes any and all combinations of one or more of the associated listed items.

Example embodiments are described herein with reference to cross-sectional illustrations that are schematic illustrations of idealized example embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

While some example embodiments of the inventive concepts have been described with reference to the accompanying drawings, it should be understood by those skilled in the art that various modifications may be made without departing from the scope of the inventive concepts and without changing essential features thereof. Therefore, the above-described example embodiments should be considered in a descriptive sense only and not for purposes of limitation.

What is claimed is:

1. A semiconductor device comprising:
   one or more switches on a substrate;
   a first electrode connected to the one or more switches and having a helical shape defining a spiral groove;
   a support in contact with the first electrode, the spiral groove extending between the support and a portion of the first electrode;
   a capacitor dielectric layer in contact with the first electrode; and
   a second electrode in contact with the capacitor dielectric layer.

2. The semiconductor device of claim 1, wherein the spiral groove is in a side surface of the first electrode.

3. The semiconductor device of claim 1, wherein a first distance across an opening of the spiral groove in a first direction is smaller than a second distance across the spiral groove in the first direction at a center of the spiral groove.

4. The semiconductor device of claim 3, wherein the second distance is a greatest distance across the spiral groove in the first direction.

5. The semiconductor device of claim 1, wherein the second electrode extends inside of the spiral groove.

6. The semiconductor device of claim 1, wherein the capacitor dielectric layer extends inside of the spiral groove between the support and the portion of the first electrode.

7. The semiconductor device of claim 1, wherein the second electrode extends inside of the spiral groove between the support and the portion of the first electrode.

8. The semiconductor device of claim 1, further comprising:
   a sacrificial pattern in the spiral groove comprising a material different from materials of the support and the first electrode.

9. The semiconductor device of claim 8, wherein the sacrificial pattern comprises a spontaneous molecular assembly nano structure formed by micro-phase separation of a block-copolymer layer.

10. The semiconductor device of claim 9, wherein the block-copolymer layer comprises at least one of an inorganic-organic diblock copolymer, an organic-organic diblock copolymer, a brush copolymer of the inorganic-organic diblock copolymer, or a brush copolymer of the organic-organic diblock copolymer.

11. The semiconductor device of claim 1, wherein a height of the first electrode is greater than a width of the first electrode.

12. The semiconductor device of claim 1, wherein the support is in direct contact with a side surface of the first electrode.

13. The semiconductor device of claim 1, wherein the capacitor dielectric layer extends between the support and the second electrode.

14. A semiconductor device comprising:
   a conductive pattern on a substrate;
   a first electrode on the conductive pattern and having a helical shape defining a spiral groove;
   a support in contact with the first electrode, the spiral groove extending between the support and a first portion of the first electrode;
   a capacitor dielectric layer in contact with the first electrode; and
   a second electrode in contact with the capacitor dielectric layer.

15. The semiconductor device of claim 14, further comprising:
   an etch stop layer between the conductive pattern and the support,
   wherein,
      the first electrode extends through the etch stop layer and contacts the conductive pattern, and
      the spiral groove extends between the etch stop layer and a second portion of the first electrode.

16. The semiconductor device of claim 14, wherein the first electrode is formed by:
   forming a mold layer on the conductive pattern;
   forming the support on the mold layer;
   forming an electrode hole extending through the support and the mold layer;
   forming a sacrificial pattern in the electrode hole;
   forming the first electrode in the electrode hole; and
   removing the mold layer and the sacrificial pattern.

17. The semiconductor device of claim 16, wherein the sacrificial pattern has a spiral shape.

18. The semiconductor device of claim 16, wherein the forming the sacrificial pattern comprises:
   forming a block-copolymer layer in the electrode hole; and
   performing micro-phase separation on the block-copolymer layer.

19. The semiconductor device of claim 18, wherein the sacrificial pattern comprises a spontaneous molecular assembly nano structure formed by the performing micro-phase separation.

20. The semiconductor device of claim 18, wherein the block-copolymer layer comprises at least one of an inorganic-organic diblock copolymer, an organic-organic diblock copolymer, a brush copolymer of the inorganic-organic diblock copolymer, or a brush copolymer of the organic-organic diblock copolymer.

* * * * *